United States Patent
Wu et al.

(10) Patent No.: US 11,714,115 B2
(45) Date of Patent: Aug. 1, 2023

(54) INSTRUMENT INTERFACING METHOD AND DEVICE THEREOF

(71) Applicant: Wei Wu, Wenzhou (CN)

(72) Inventors: Wei Wu, Wenzhou (CN); Yuejia Wu, Wenzhou (CN)

( * ) Notice: Subject to any disclaimer, the term of this patent is extended or adjusted under 35 U.S.C. 154(b) by 0 days.

(21) Appl. No.: 17/625,768

(22) PCT Filed: Mar. 11, 2021

(86) PCT No.: PCT/CN2021/080317
§ 371 (c)(1),
(2) Date: Oct. 2, 2022

(87) PCT Pub. No.: WO2021/190323
PCT Pub. Date: Sep. 30, 2021

(65) Prior Publication Data
US 2023/0043853 A1    Feb. 9, 2023

(30) Foreign Application Priority Data
Mar. 24, 2020    (CN) .......................... 202010211081.5

(51) Int. Cl.
*G01R 31/00*    (2006.01)

(52) U.S. Cl.
CPC .................................. *G01R 31/001* (2013.01)

(58) Field of Classification Search
CPC .................................................. G01R 31/001
USPC .......................................................... 702/57
See application file for complete search history.

(56) References Cited

U.S. PATENT DOCUMENTS

| | | | | |
|---|---|---|---|---|
| 2015/0097575 A1* | 4/2015 | Hiraga | ................. | G01R 31/002 |
| | | | | 324/537 |
| 2019/0241284 A1* | 8/2019 | Benward | ................ | G01R 27/04 |
| 2020/0371148 A1* | 11/2020 | Scott | ...................... | G06N 20/10 |

OTHER PUBLICATIONS

Name of the author: Yong Liu, title of the article: DC/AC Power Side Conducted Emi Noise Diagnosis and Suppression Technology Research title of item: Master degree thesis; date: Dec. 15, 2014; pp. 11-12; Publisher Nanjing Normal University, China.

* cited by examiner

*Primary Examiner* — Ricky Go

(57) ABSTRACT

An instrument interface method and device. Two capacitors, one capacitor has one end as input of the device, connected to live line of power output of a LISN, and has other end as output of the device, connected to one test port of an oscilloscope; the other capacitor has one end as input of the device, connected to neutral line of the power output of the LISN, and has other end as output of the device, connected to another test port of the oscilloscope; without changing the LISN design, existing LISN products can be used for conducted emission test with oscilloscope-based time-domain EMI measurement instruments by means of the method and device. Said two capacitors have a capacity of <0.09 µF, which reduced the requirements of oscilloscope's A/D conversion, making low-cost oscilloscope can also be used for EMI testing.

9 Claims, 1 Drawing Sheet

INSTRUMENT INTERFACING METHOD AND DEVICE THEREOF

CROSS-REFERENCE TO RELATED APPLICATION

The present application is based on, and claims priority from, Chinese application number 202010211081.5, filed on Mar. 24, 2020, the disclosure of which is hereby incorporated by reference herein in its entirety.

FIELD OF THE INVENTION

The present invention relates to instrument interfacing methods and devices, and in particular to a method and device for interfacing between a Line Impedance Stabilization Network (LISN) and an oscilloscope.

BACKGROUND OF THE INVENTION

Electronic products are designed not only to meet functional requirements, but also to comply with electromagnetic compatibility (EMC) standard requirements, and therefore need to test the electromagnetic interference (EMI) of the product. The EMI test of the product is usually divided into conducted emission test and radiation emission test; where the conducted emission test requires a LISN to isolate the power supply and the Equipment Under Test (EUT), the power input of the LISN is connected to the power supply live line L and neutral line N; the power supply live line L' and power supply neutral line N' at the power output port of the LISN are connected to the EUT, the EMI generated by the EUT is conducted to the LISN through L' and N', and is picked up by the test instrument at the LISN signal output port RF.

Usually the instrument employed for conducted emission test is a spectrum analyzer. The conducted emission test needs to measure the EMI voltage at L' or N' to ground or protective earth (PE), as the spectrum analyzer has only one input port, usually the RF port of the LISN is connected to the input port of the spectrum analyzer through a cable, by toggling a selectable switch on the LISN panel to connecting L' or N' to complete the L' to PE and N' to PE tests respectively.

In recent years oscilloscope-based time-domain EMI measurements have been going on from research into industrial applications. Using an oscilloscope instead of a spectrum analyzer for EMI test can usually shorten test time, the two test channels of the oscilloscope can simultaneously test the EUT's L' to PE and N' to PE EMI and calculate the EUT's common mode and differential mode interferences, especially suitable for EMC pre-compliance testing of products. However, the existing LISN products with a single RF output port plus toggle switch cannot meet the requirements of oscilloscope multi-channel test, and there is a need to design a method and device to meet the requirements.

SUMMARY OF THE INVENTION

The technical problem actually solved by this application is to design a method and device to meet the requirements of oscilloscope multi-channel measurement, which is realized by using the following technical solutions, including A method of instrument interface, wherein it comprises:
connecting power output of a LISN, to one end of a capacitor, and connecting other end of the capacitor to test port of an oscilloscope; the capacitor having a capacity<0.09 µF.

The method, wherein the power output of the LISN comprises either a live line or a neutral line.

The method, wherein said connecting other end of the capacitor to test port of an oscilloscope, comprises connecting to the test port of an oscilloscope through a resistor.

The method, wherein said connecting other end of the capacitor to test port of an oscilloscope, comprises connecting to the test port of an oscilloscope directly.

The method, wherein the other end of the capacitor is connected to one end of a resistor, and other end of the resistor is connected to earth or protective earth; where the resistor is an option.

An instrument interface device, wherein it comprises:
two capacitors, one capacitor has one end as input of the device, connected to live line of power output of a LISN, and has other end as output of the device, connected to one test port of an oscilloscope; the other capacitor has one end as input of the device, connected to neutral line of the power output of the LISN, and has other end as output of the device, connected to another test port of the oscilloscope; said two capacitors have a capacity of <0.09 µF.

The device, wherein said one end of capacitor as output of the device, is connected in series with a resistor to earth or protective earth; the resistance value of the resistor is greater than 200 ohms.

The device, wherein said one end of capacitor as output of the device, is not connected in series with a resistor to earth or protective earth.

The device, wherein said device is self-contained and connected to the LISN and the oscilloscope.

This self-contained interface device can be carried around and easily connect conventional LISN products to the oscilloscope without the need to modify the LISN products.

The device, wherein said device is integrated with LISN to form a LISN with function of interfacing with an oscilloscope.

This technical solution of integrating the described interface device with LISN allows the integrated LISN to be connected to both an oscilloscope or a conventional spectrum analyzer, expanding the scope of application of the LISN.

IEC publication CISPR 16-1-2 and its corresponding Chinese standard GB/T 6113.102 I/2008/CISPR 16-1-2: 2006 make standard provisions for the isolation value and output impedance curve of LISN, while giving the electrical schematic diagram of LISN that can meet these standard specifications, where the component parameters determine the output impedance curve of LISN. LISN manufacturers follow these electrical schematics and their parameters to ensure that the standard specifications are met.

According to the said standard, the capacity of the said capacitor should be greater than or equal to 0.1 µF. However, the applicant of the present application mistakenly used a capacitor of 0.01 µF when making the said interface, but unexpectedly found that 1. The measurement requirements which originally required to use an oscilloscope with an A/D converter of 12 bits or more, now can be met by using a low-cost oscilloscope with an 8-bit A/D converter, and, 2. As capacity of the capacitor was reduced leads to an increase in impedance, which compresses the amplitude of the overshoot signal inputted to the oscilloscope and reduces the risk of damage to the oscilloscope due to input signal overload. Through simulation calculations and experimental verification, the applicant of the present application determined that the above two unexpected benefits can be obtained by controlling the capacity of the above capacitor to <0.09 µF.

The principle is as follows:

The capacity of the above-mentioned capacitor used in a conventional LISN products is greater than or equal to 0.1 µF. Since the measured signal reaches the oscilloscope test port at a higher voltage even being stepped down through this capacitor, for an oscilloscope with a vertical scale of 8 division, the vertical scale needs to be set at a range of at least 1V per division, otherwise the signal may be truncated, resulting at signal lost. At this point, an 8-bit A/D converter oscilloscope, as the 8th power of 2 equals 256, the vertical resolution at a range of 1V/div is 1V×8/256=31.25 mV, which means that the EMI with an amplitude<31.25 mV cannot be identified. Usually, the minimum amplitude of EMI generated by the EUT is 10 mV or less, therefore, it is necessary to use an oscilloscope with A/D conversion bits>8. For example, an oscilloscope with a 12-bit A/D converter, as the 12th power of 2 is 4096, in the same case, the vertical resolution of an oscilloscope with a 12-bit A/D converter is 1V×8/4096=1.95 mV, which means that can identify the EMI with amplitude>1.95 mV. However, oscilloscopes with 12-bit A/D converters are usually very expensive.

If we reduce the capacity of the capacitor, so that the maximum voltage of the signal going through the capacitor arriving at the test port of the oscilloscope will be reduced, then the signal will not be truncated even the vertical scale of the oscilloscope is setup at a division small than 1V/div, or only be truncated slightly that does not affect the EMI test. For example, using an oscilloscope with 8-bit A/D converter and with vertical scale set to 0.2V/div, the oscilloscope can identify the minimum signal amplitude of 0.2V×8/256=6.25 mV; and, because the maximum voltage of the signal arriving at the test port of the oscilloscope is reduced to the original 1/5, reducing the risk of damage to the oscilloscope due to input signal overload. Based on the above principle, we can reduce the capacity of the capacitor to improve the vertical resolution of the oscilloscope to meet the different EMI test requirements.

Through simulation calculations and test verification, we determined that by controlling capacity of the above-mentioned capacitor to <0.09 µF, an oscilloscope with 8-bit A/D converter can also meet the requirements of conducted emission test. Customized according to the technical solution discussed above, the interfacing method and device not only realize the connection from LISN to oscilloscope, but also make the low-cost oscilloscope can be employed at the test, which reduces the cost of test system.

Advantages

The beneficial effect of the method and device disclosed in this application is that 1. No need to change the LISN design, so that the existing LISN products can be used with an oscilloscope for conducted emission test.

2. Can be made into a portable device for the connection between the LISN and the oscilloscope.

3. It can be integrated with LISN, so that LISN can not only be used for conducted emission test with a conventional spectrum analyzer, but also the test with an oscilloscope.

4. Reduced the requirements of oscilloscope's A/D conversion, making low-cost oscilloscope can also be used for EMI testing.

5. Reduced the amplitude of the signal at the input of the oscilloscope, so that the risk of damage to the oscilloscope due to signal overload was reduced.

DESCRIPTION OF THE PREFERRED EMBODIMENT

The following gives further detailed description of the present application in conjunction with the drawings and embodiments.

Figure 1:
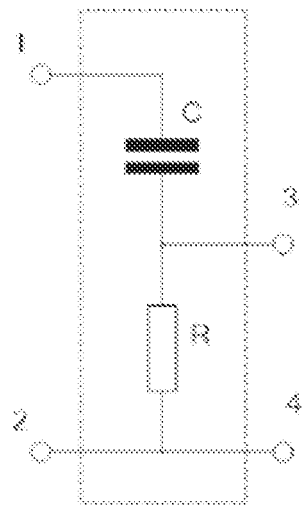
FIG. 1 is a schematic diagram of the method disclosed in the present application.

FIG. 1 is a schematic diagram of the interface method disclosed in the present application. The application discloses a method for interfacing a LISN with an oscilloscope, specifically comprising:

connecting live line or neutral line of output of LISN, to one end of a capacitor C, i.e., terminal 1 of FIG. 1; and other end of the capacitor C, i.e., terminal 3 of FIG. 1, to oscilloscope test port either directly or through a resistor; said capacitor C has a capacity<0.09 µF. Between terminal 3 and terminal 2(4) of FIG. 1, a resistor R connected is a leakage resistor for releasing the charge on the capacitor C, its resistance value is >200 ohms to avoid too much impact on the oscilloscope input impedance and, the resistor R is an option. The terminals 2 and 4 are connected to earth or protective earth (PE), and if the resistor R is eliminated, terminals 2 and 4 can also be eliminated.

EMBODIMENTS

Figure 2:
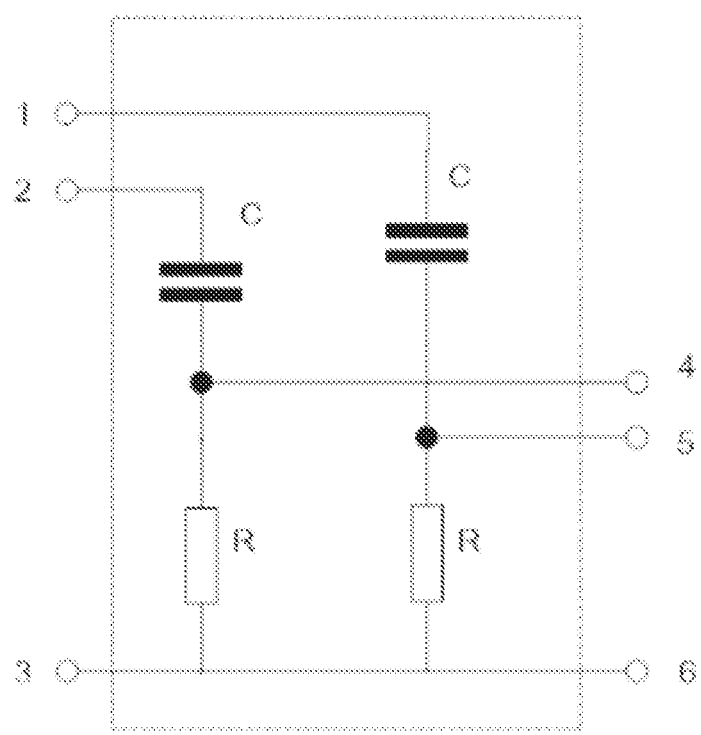
FIG. 2 is a schematic diagram of the device disclosed in the present invention.

The following embodiments combining with FIG. 2 further illustrates the work principle of present method and device.

Embodiment 1

As shown in FIG. 2, capacitor C in series with resistor R is connected to terminals 2 and 3 and 1 and 3, and terminals 3 and 6 are connected; two C and R connection points connect terminals 4 and 5 respectively, thus constructed a device connecting LISN to oscilloscope, while among which the capacitor C has a capacity of <0.09 µF and the resistor R is optional and can be cancelled. In this embodiment, the Capacitor C has a capacity of 0.082 µF, and resistor R has a resistance of 1000 ohms. Connect terminals 1, 2 and 3 to wires L, N and PE of a three-pin power plug (not shown in the diagram) respectively, then plug the power plug into a socket connected to the output power supply of the LISN, also plug the input power plug of the EUT into the socket, thus completing the connection of the input of the device to the output power supply of the LISN. Furthermore, the output terminals 5 and 6 of the device are connected to a BNC socket (not shown in the diagram), where terminal 5 is connected to the inner core of the BNC and terminal 6 is connected to the outer shell of the BNC; the output ports 4 and 6 are connected to another BNC socket (not shown in the diagram), where terminal 4 is connected to the inner core of the another BNC and port 6 is connected to the outer shell of the another BNC; the two BNC sockets are connected to two test channels of the oscilloscope via cables respectively, thus completing the connection of the device to the oscilloscope.

In this embodiment, conducted interference in the frequency range of 150 kHz to 30 MHz is measured. The capacitor C used in the interface device has a non-negligible impedance at the low frequency, resulting in low measurement values, and the smaller the capacity of the capacitor C, the wider the frequency range affected, so it is necessary to do subsequent processing of the oscilloscope measurement results by calculating corresponding compensation; a person of ordinary skill in the field knows the calculation method of such compensation, so it is not given here.

During the implementation of this embodiment, the following comparative tests were also done to verify the effectiveness of the present invention:

Test 1, capacitor C capacity of 0.1 µF is used. In normal noisy office environment, the vertical scale of an oscilloscope needs to be set to 1V/Division, testing with an oscilloscope with 8-bit A/D converter obtained a significantly low amplitude of electromagnetic interference; while testing with another oscilloscope with 12-bit A/D converter obtained a normal amplitude of electromagnetic interference. Save the test results.

Test 2, capacitor C capacity of 0.082 µF is used. In the same test site, testing with the oscilloscope with 8-bit A/D converter. Because change of capacity of the capacitor C reduced the maximum amplitude of output signal of the device, the vertical scale of the oscilloscope is set to 0.2V/Division, the test result is similar to that of test 1 using the oscilloscope with 12-bit AID converter as described above.

Comparing test 1 and test 2, we found that both realized the connection between the oscilloscope and LISN, solving the technical problem described above; however, the test 2 was able to complete the required test with a low-cost oscilloscope with 8-bit A/D converter due to the reduced capacity of capacitor C; moreover, the smaller capacity of capacitor C reduced the amplitude of the signal inputted to the test port of the oscilloscope, reducing the risk of the oscilloscope damage by signal overload; obtained unexpected technical benefits.

Embodiment 2

This embodiment is the same as embodiment 1, but with the elimination of the resistor R.

Embodiment 3

This embodiment is the same as embodiment 1, but the device is mounted inside or on the surface of the LISN, integrated with the LISN, and the capacity of the capacitor C is further reduced to 0.068 µF. It is a test for product EMC pre-compliance and the results are similar to those of standard laboratory tests.

Embodiment 4

This embodiment is the same as embodiment 1, but the device output terminals 4 and 5 are connected to the input of the oscilloscope through resistors. Again, the capacitor C has a capacity of <0.09 and the resistor is an option.

Industrial Applicability

The method and device disclosed in this application satisfy the need for interfacing between a LISN and an oscilloscope. Simple in structure, it can be made into a portable device for connecting the LISN to the instrument without changing the LISN design. The device can also be integrated with a LISN, making it possible not only to use the LISN for traditional spectrometer-based EMI test, but also for oscilloscope-based EMI test.

The above described are only some embodiments of the present invention, not all of them. Based on the embodiments disclosed in this application, all other embodiments obtained by a person of ordinary skill in the art without making creative work, are within the scope of the protection of the present invention.

The invention claimed is:

1. A method of instrument interface, wherein the method comprises:
   connecting power output of a Line Impedance Stabilization Network (LISN), to one end of a capacitor, and connecting other end of the capacitor to test port of an instrument; the capacitor having a capacity<0.09 µF.

2. The method according to claim 1, wherein the power output of the LISN comprises either a live line or a neutral line.

3. The method according to claim 1, wherein said connecting other end of the capacitor to test port of an instrument, comprises connecting to the test port of an instrument through a resistor.

4. The method according to claim 1, wherein said connecting other end of the capacitor to test port of an instrument, comprises connecting to the test port of an instrument directly.

5. The method according to claim 1, wherein the other end of the capacitor is connected to one end of a resistor, and other end of the resistor is connected to earth or protective earth; where the resistor is an option.

6. A device of instrument interface, wherein the device comprises:
   two capacitors, one capacitor has one end as input of the device, connected to live line of power output of a Line Impedance Stabilization Network (LISN), and has other end as output of the device, connected to one test port of an instrument; the other capacitor has one end as input of the device, connected to neutral line of the power output of the LISN, and has other end as output of the device, connected to another test port of the instrument; said two capacitors have a capacity of <0.09 µF.

7. The device according to claim 6, wherein said device is self-contained and connected to the LISN and the instrument.

8. The device according to claim 6, wherein said device is integrated with LISN to form a LISN with function of interfacing with the instrument.

9. The device according to claim 8, wherein LISN with function of interfacing with the instrument can be used not only for conventional spectrum-based Electromagnetic Interference (EMI) testing, but also for oscilloscope-based EMI testing.

* * * * *